(12) United States Patent
Zach

(10) Patent No.: US 6,182,355 B1
(45) Date of Patent: Feb. 6, 2001

(54) APPARATUS FOR POSITIONING A TOOL ON A CIRCUIT BOARD

(76) Inventor: Hubert Zach, Holstweg 16, 14163 Berlin (DE)

( * ) Notice: Under 35 U.S.C. 154(b), the term of this patent shall be extended for 0 days.

(21) Appl. No.: 09/389,158

(22) Filed: Sep. 2, 1999

Related U.S. Application Data

(62) Division of application No. 09/019,488, filed on Feb. 5, 1998, now Pat. No. 6,065,205.

(30) Foreign Application Priority Data

Feb. 19, 1997 (DE) .............................. 197 08 464

(51) Int. Cl.[7] ..................................................... B23P 19/00
(52) U.S. Cl. ................................ 29/740; 29/834; 29/833; 29/721; 348/87
(58) Field of Search ........................... 29/740, 741, 742, 29/739, 833, 834, 721; 348/87

(56) References Cited

U.S. PATENT DOCUMENTS

| | | | |
|---|---|---|---|
| 3,887,997 | * 6/1975 | Hartleroad et al. ................... | 29/587 |
| 4,598,456 | * 7/1986 | McConnell .............................. | 29/407 |
| 5,177,864 | * 1/1993 | Oyama ..................................... | 29/833 |
| 5,249,349 | * 10/1993 | Kuinose et al. ......................... | 29/721 |
| 5,249,356 | * 10/1993 | Okuda et al. ........................... | 29/833 |
| 5,311,304 | * 5/1994 | Monno ..................................... | 348/87 |
| 5,379,514 | * 1/1995 | Okuda et al. ........................... | 29/833 |
| 5,699,193 | * 12/1997 | Monno et al. ........................ | 359/630 |
| 5,942,083 | * 8/1999 | Sugiyama ............................. | 156/556 |
| 5,992,013 | * 11/1999 | Morita ..................................... | 29/833 |

FOREIGN PATENT DOCUMENTS 5-152356 * 6/1993 (JP) ........................................ 29/740

* cited by examiner

Primary Examiner—Jessica J. Harrison
Assistant Examiner—Minh Trinh
(74) Attorney, Agent, or Firm—Paul F. Schenck

(57) ABSTRACT

A placement apparatus for co-planar placement of a tool on a component carrier using a rotational placement arm in which the tool is moved between the base or loading position of the placement arm and the near-placement position substantially on a circular path, and in which the tool is moved linearly between the near-placement position and the placement position.

3 Claims, 3 Drawing Sheets

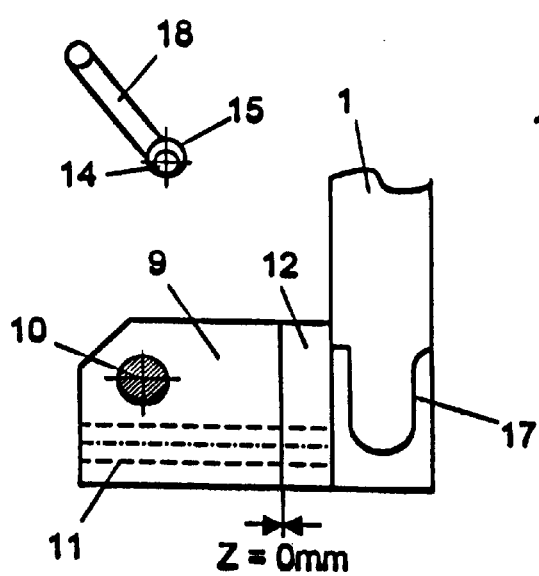
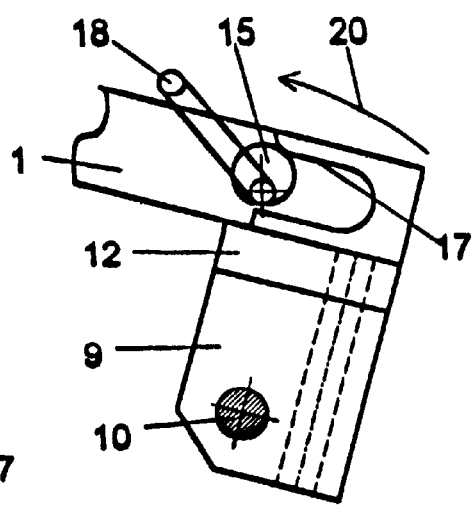
FIG 3A
FIG. 3B
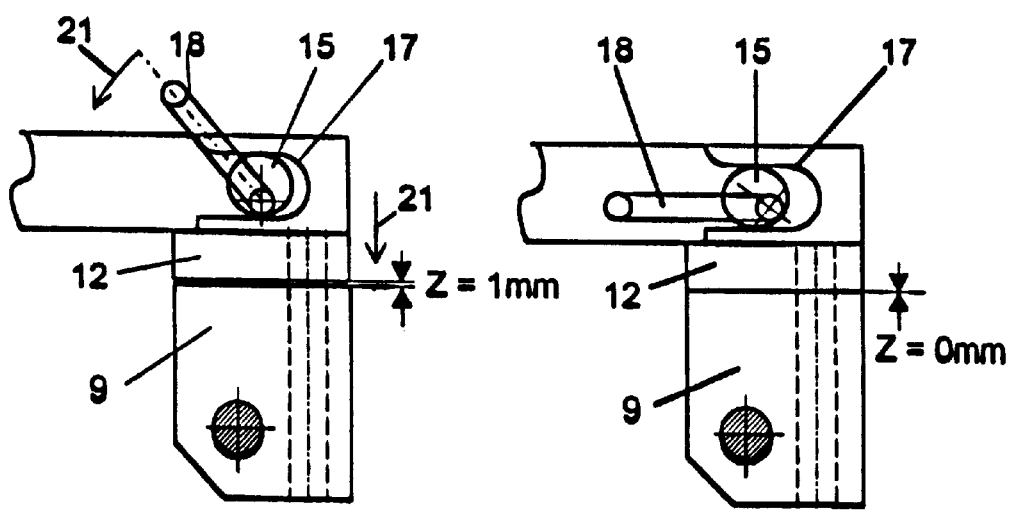
FIG. 3C
FIG. 3D

APPARATUS FOR POSITIONING A TOOL ON A CIRCUIT BOARD

This is a division of application Ser. No. 09/019,488, filed Feb. 5, 1998, now U.S. Pat. No. 6,065,205 issued on May 23, 2000.

BACKGROUND OF THE INVENTION

The increased complexity of integrated circuits resulted in packages with large numbers of terminals for connection with printed circuit boards (PCBs) and other types of carriers interconnecting integrated circuits with each other and devices external to such carriers. A number of placement apparatuses are available on the market or disclosed in the literature, including German patent document DD 242 320 and U.S. Pat. No. 5,311,304. Placement apparatuses are used for proper positioning of electronic components, especially components with large numbers of terminals, on a recipient, such as on PCBs and other carriers, using surface mount technologies. Part of such an apparatus is an X-Y table for holding the recipient and a placement arm for handling the electronic component using e.g. a vacuum holder. The bottom side of the component held by the placement arm in a first position and the mounting side of the carrier are illuminated by a light source. A semipermeable optical component such as a prism is arranged in such a fashion that a combined view is generated showing the real picture of the positioning location of the electronic component on the mounting side of the carrier and the virtual picture of the bottom side of the electronic component. By movement of the X-Y table the picture of the positioning location is moved relative to the picture of the underside of the electronic component until corresponding elements in both pictures match. Thereafter, without further movement of the X-Y table the placement arm with the electronic component is rotated from its first position by 90° towards the placement position opposite the mounting surface side of the carrier until the terminals of the electronic component contact the corresponding pads on the carrier. After performing a solder operation the electronic component is released from the placement arm, which then returns to its original first position.

During the 90° rotation of the placement arm the terminals of the electronic component located close to the rotational axis of the placement arm touch the surface of the carrier first, while the terminals further away from the rotational axis of the placement arm are last to touch the surface of the carrier. This means that the electronic component is not coplanar with the surface of the carrier while it is placed on the carrier. Significant errors in placement may result.

SHORT DESCRIPTION OF THE INVENTION

The component placement apparatus of the present invention includes means for advancing the electronic component to be placed so that the component is held by the placement arm coplanar to the surface of the carrier just prior to its placement, and then is placed in position on the carrier in a linear movement normal to the carrier surface.

OBJECTS OF THE INVENTION

It is an object of the invention to provide for coplanar positioning of an electronic component relative to the surface of a component carrier prior and during final placement of the component.

It is another object of the invention to provide for coplanar placement of an electronic component relative to the surface of a component carrier prior and during placement of the component in a placement apparatus having a rotating placement arm.

It is another object of the invention to provide for an apparatus for placement of electronic components on a component carrier using a rotational placement arm with combined rotational and linear placement movement for the electronic component.

It is another object of the invention to provide for an apparatus for placement of electronic components on a component carrier using a rotational placement arm having a near-placement position and a placement position.

It is another object of the invention to provide for an apparatus for placement of electronic components on a component carrier using a rotational placement arm in which the electronic component is moved between the base or loading position of the placement arm and the near-placement position substantially on a circular path, and in which the component is moved linearly between the near-placement position and the placement position.

It is another object of the invention to provide for an apparatus for placement of electronic components on a component carrier using a rotational placement arm in which the electronic component is moved from the base position of the placement arm in a substantially quarter circle into a near-placement position coplanar with the surface of the carrier, and in which the component is moved linearly between the near-placement position and the placement position.

It is another object of the invention to provide for an apparatus for placement of electronic components on a component carrier using a rotational placement arm in which the electronic component is moved from the base position of the placement arm in a substantially quarter circle into a near-placement position in which the electronic component is positioned coplanar with the surface of the carrier, wherein the substantially quarter circle is less than 90° and includes a first part which is rotational and a second part which consists of a combination of a rotational movement and an eccentric controlled second movement.

It is another object of the invention to provide for an apparatus for placement of electronic components on a component carrier using a rotational placement arm in which the electronic component is moved from the base position of the placement arm in a substantially quarter circle into a near-placement position in which the electronic component is positioned coplanar with the surface of the carrier, wherein the substantially quarter circle movement is less than 90° and includes a first part which is rotational and a second part which consists of a combination of a rotational movement and an eccentric controlled linear movement.

SHORT DESCRIPTION OF THE FIGURES

FIGS. 3A–3D are illustrations of the eccentric means controlling the linear movement of the component to be placed.

DETAILED DESCRIPTION OF THE INVENTION

Figure 1:
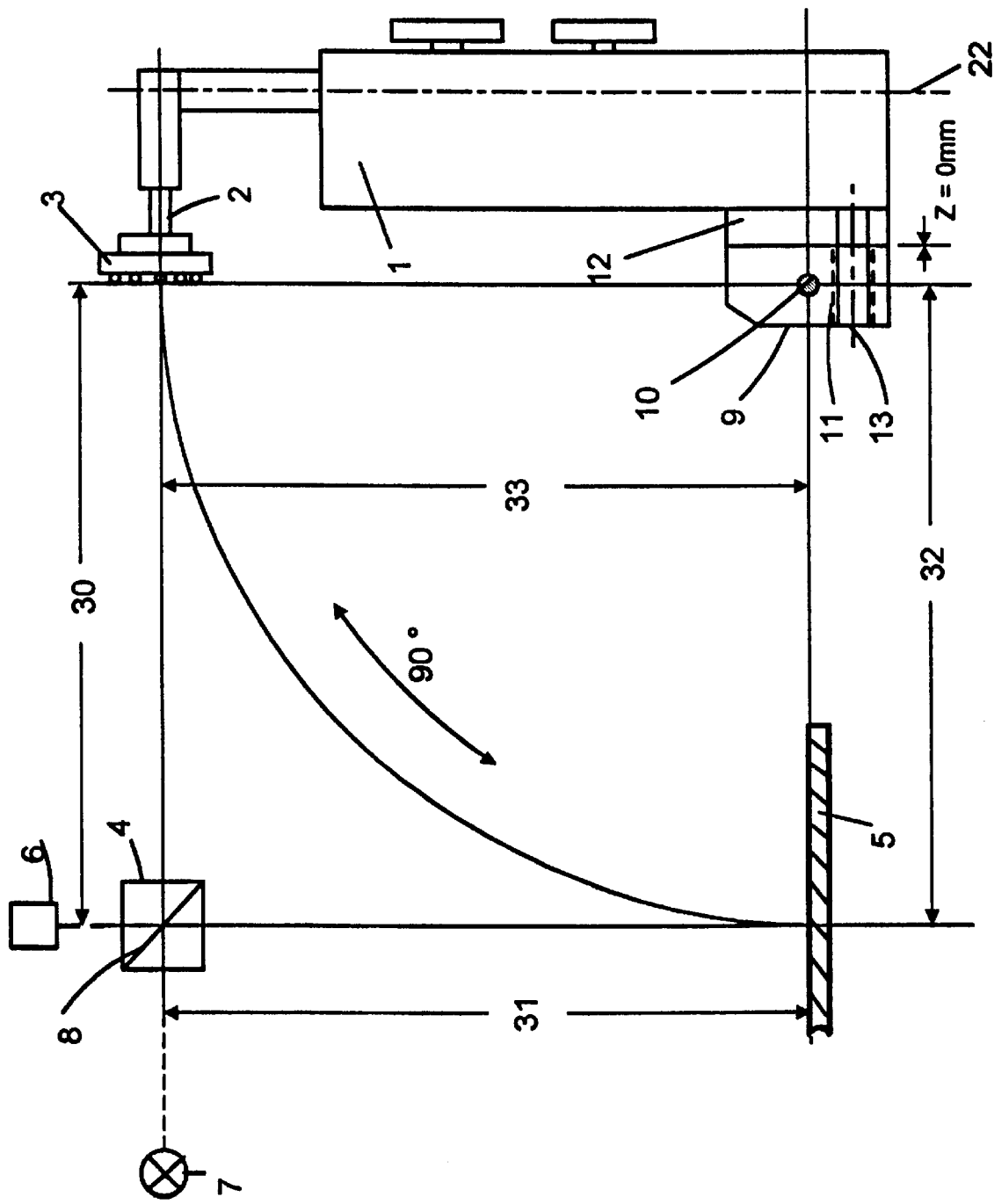
FIG. 1 is an illustration of the placement apparatus with the placement arm in its first position.

FIG. 1 is an illustration of the placement apparatus with the placement arm in its first position for positioning of the component carrier using the X-Y-table. The major components of the apparatus are placement arm 1, component holder 2 for the electronic component 3 which is to be placed on component carrier or circuit board 5. A beam splitter 4, a light source 7 and a microscope 6 are provided for the alignment of component and component carrier. Microscope 6 can be replaced with a video camera or could include suitable equipment for displaying the images provided by beam splitter 4. The cube shaped beam splitter 4 includes a semipermeable reflecting plane 8 mounted under 45°. For precise positioning of electronic component 3 on the surface of carrier 5 four distances in the arrangement have to be equal:

- distances 30 between the center of semipermeable reflecting plane 8 and bottom side of component 3,
- distance 31 between the center of semipermeable reflecting plane 8 and the topside of circuit board 5 at the intended placement location of component 3 on carrier 5,
- distance 32 between the center of the intended placement location of component 3 on carrier 5 and the center of the rotational movement of placement arm 1, and
- distance 33 between the center of the rotational movement of placement arm 1 the center of the bottom side of component 3.

Placement arm 1 has a component holder 2 at one end and an arm base 12 attached to one side at the other end. Arm base 12 is linked to bearing block 9 for rotation around axis 10. Axis 10 is mounted on a base plate of the apparatus in a first plane common with the component mounting surface of component carrier 5, and in a second plane common with the bottom side of component 5, when the component is placed in component holder 2 and placement arm 1 is in its first, upright position. Linkage between placement arm 1 and bearing block 9 is established by two parallel guiding pins 13 attached to placement arm 1, which glide in two guiding holes 11. Guiding pins 13 and guiding holes 11 are provided to offset placement arm 1 from axis 10 in a direction normal to the longitudinal axis 22 of placement arm 1. (In the side view illustrations of placement arm 1 only one of the pins 13 and a guiding holes 11 are visible.)

Figure 2:
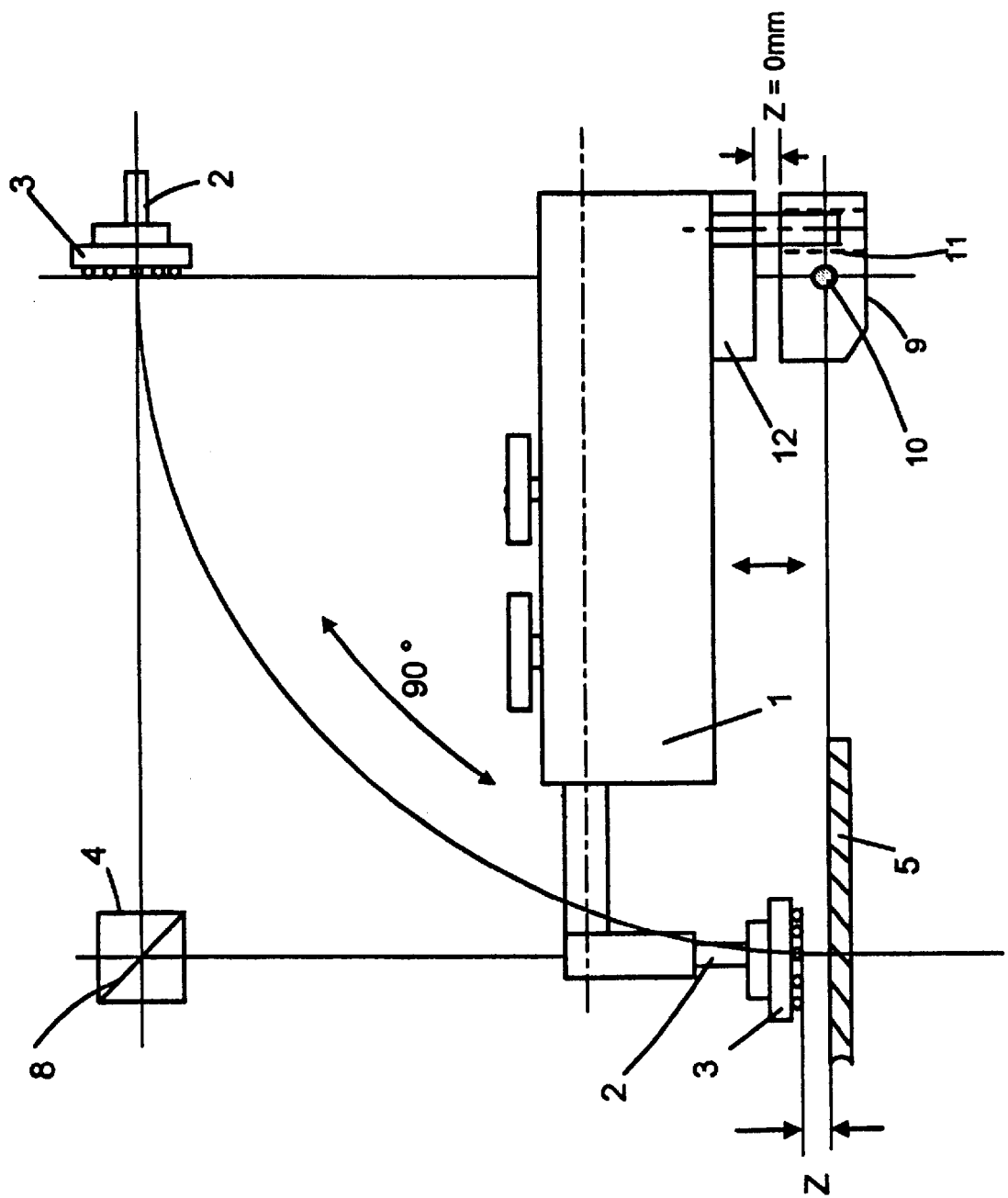
FIG. 2 is an illustration of the placement apparatus with the placement arm in the near-placement position.

FIG. 2 is an illustration of the placement apparatus with the placement arm in the near-placement position. Compared with FIG. 1, arm 1 has been turned counter-clockwise by 90°. During this operation rotation arm 1 and arm base 12 are lifted off bearing block 9. In FIG. 2 this space marked Z is 1 mm; however other values can be achieved if required by the size of the component to be placed. Thus, component 3 held by component holder 2 has been moved on a trace consisting of a substantially quarter circle and a linear movement. After this composite movement component 3 and placement arm 1 reached the near-placement position. The placement operation is completed by linear movement of arm 1, reducing gap Z to 0 mm.

FIGS. 3A–3C are illustrations of the eccentric means controlling the linear movement of the component to be placed for providing the offset. A cam shaft is used to control the offset movement of placement arm 1 relative to axis 10. The cam shaft consists of a shaft 14 with an eccentrically attached ball bearing 15 as eccentric. Lever 18 is provided to set rotational position of shaft 14. Shaft 14 of the cam shaft and axis 10 of placement arm 1 are mounted on the base plate of the apparatus. Counter part of ball bearing 15 the cam shaft is a curved cam guide 17 attached to placement arm 1 near arm base 12. In FIG. 3A arm 1 is in loading position, as shown in FIG. 1. During rotation of placement arm 1 around axis 10 towards the near-placement position arm 1 reaches a position illustrated in FIG. 3B. At this position cam guide 17 engages with ball bearing 15. During further movement in the direction indicated by arrow 20 ball bearing 15 rolls along the upper section of cam guide 17, and arm base 12 and arm 1 are lifted off bearing block 9 generating gap Z between arm base 12 and bearing block 9. The rotational movement of arm 1 is finished as shown in FIG. 3C. The next step is to reduce or eliminate offset Z, moving component 3 from the near-placement position to the placement position shown in FIG. 3D. Offset Z is reduced or eliminated by rotating cam shaft axis 14 in the direction indicated by arrow 21 using lever 18, thereby changing the rotational position of ball bearing 15 relative to cam guide 17. This lowers arm 1 and the attached component 3 into placement position.

With these main features the apparatus functions as follows. First an electronic component 3 is attached to component holder 2 of placement arm 1 in such manner that the bottom side of component 3 points toward semi-permeable reflecting plane 8. The operator will observe through semi-permeable reflecting plane 8 the relative position between the bottom side of component 3 and the intended placement position of component 3 in the top surface of component carrier 5. Using the X-Y table on which component carrier 5 is mounted, both the images of the bottom side of component 3 and the intended placement location of component 3 on carrier 5 are matched. Next, placement arm 1 is rotated 90° from its first position, in which the images are matched, to a near-placement position close to carrier 5. During this movement, shortly before reaching near-placement position (see FIG. 3B) ball bearing 15 engages with cam guide 17 and widens gap Z. When component 3 reaches the near-placement position (see FIG. 3C) it is coplanar with the top surface of component carrier 5.

Turning lever 18 in the direction indicated by arrow 21 the operator reduces gap Z, thereby lowering component 3 towards surface 5 of component carrier 5. During this operation component 3 remains coplanar with the top surface of component carrier S. Because of the coplanar movement of component 3 all terminals of component 3 touch the surface of component carrier 5 at the same time.

When handling a component 3 of a larger size it may be necessary to move beam splitter 4 out of the way of component 3 while placement arm 1 is lowered from the first position towards the near-placement position. To simplify unsetting and resetting of beam splitter 4, beam splitter 4 and its adjustment facilities are mounted on a carriage which can be moved sideways either manually or with the help of a controlled actuator. Control of a movement actuator can be made dependent on the area viewed through the microscope or the video camera in such a fashion that when the viewed area to receive a component 3 exceeds a set value, then it is assumed that the component is so large that beam splitter 4 has to be moved out of the way for lowering placement arm 1 with component 3 from the first position of placement arm 1 towards its near-placement position.

Instead of attaching an electronic component to the placement arm, it is within the scope of this invention to attach a tool to the placment arm, moving the tool carrying placement arm towards a placement position on a circuit board and perform a desired function in which a coplanar positioning of the tool in the circuit board is required. Such tools include a) test adapters with test probe adapters having test probes which require a positioning coplanar with the circuit board for in-circuit tests of the circuit board, b) soldering tools designed for use in combination with multi-terminal electronic components to attach or remove such an electronic component, c) means for printing patterns, such as text, lines or soldering paste patterns etc., on a circuit board; such printing means include print heads which require coplanar placement on the circuit board to ensure reproduction of a clean and clear pattern.

What I claim is:

1. An apparatus for positioning a tool coplanar on a circuit board including a tool placement arm having a first position and a circuit board having a placement location for said tool, comprising an optical alignment system including an optical component for simultaneously observing said tool when said tool placement arm is in said first position, and said placement location when said tool and said placement location are in an aligned position, said tool placement arm providing for rotational movement of said placement arm around an axis for moving said tool from said first position to a near-placement position, and from said near-placement position to a second position on said circuit board, wherein said tool in said near-placement position is coplanar with said circuit board and is moved in a linear movement normal to said circuit board from said near-placement position to said second position.

2. The apparatus for positioning a tool coplanar on a circuit board as claimed in claim 1, wherein said tool is a multi-test probe adapter for performing an in-circuit test with said circuit board.

3. The apparatus for positioning a tool coplanar on a circuit board as claimed in claim 1, wherein said tool is a printing plate for reproducing a pattern on said circuit board.

* * * * *